United States Patent
Wang

(10) Patent No.: US 10,665,641 B2
(45) Date of Patent: May 26, 2020

(54) COLOR FILTER (CF) SUBSTRATE, MANUFACTURING METHOD THEREOF, DISPLAY PANEL AND DISPLAY DEVICE

(71) Applicant: BOE TECHNOLOGY GROUP CO., LTD., Beijing (CN)

(72) Inventor: Huifeng Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 20 days.

(21) Appl. No.: 16/079,697

(22) PCT Filed: Dec. 12, 2017

(86) PCT No.: PCT/CN2017/115655
§ 371 (c)(1),
(2) Date: Aug. 24, 2018

(87) PCT Pub. No.: WO2018/209933
PCT Pub. Date: Nov. 22, 2018

(65) Prior Publication Data
US 2019/0280049 A1    Sep. 12, 2019

(30) Foreign Application Priority Data
May 18, 2017    (CN) .......................... 2017 1 0353545

(51) Int. Cl.
*H01L 27/32* (2006.01)
*H01L 51/52* (2006.01)
*H01L 51/56* (2006.01)

(52) U.S. Cl.
CPC ............ *H01L 27/322* (2013.01); *H01L 27/32* (2013.01); *H01L 27/3244* (2013.01);
(Continued)

(58) Field of Classification Search
CPC ............... H01L 27/322; H01L 27/3211; H01L 2227/323
See application file for complete search history.

(56) References Cited

U.S. PATENT DOCUMENTS 7,545,475 B2 * 6/2009 Kawamura ......... G02F 1/13394
349/155
8,593,536 B2 * 11/2013 Maruyama ................ G06T 7/80
348/218.1
(Continued)

FOREIGN PATENT DOCUMENTS

CN    104765188 A    7/2015
CN    105118928 A    12/2015
(Continued)

OTHER PUBLICATIONS

International Search Report and Written Opinion dated Mar. 9, 2018 from State Intellectual Property Office of the P.R. China.

*Primary Examiner* — Quoc D Hoang
(74) *Attorney, Agent, or Firm* — Dilworth & Barrese, LLP.; Michael J. Musella, Esq.

(57) ABSTRACT

A color filter (CF) substrate, a manufacturing method thereof, a display panel and a display device are disclosed. The CF substrate includes a plurality of sub-pixels, each of the plurality of sub-pixels including a CF layer, the CF layer being configured to allow light passing through the sub-pixel to display one color, and a barrier being disposed between at least two adjacent sub-pixels of different colors, and the barrier continuously extending between the sub-pixels separated by the barrier. The CF substrate can reduce influence on chromaticity of adjacent sub-pixels caused by light leakage.

19 Claims, 6 Drawing Sheets

(52) U.S. Cl.
CPC .......... *H01L 51/52* (2013.01); *H01L 51/5271* (2013.01); *H01L 51/5284* (2013.01); *H01L 51/56* (2013.01); *H01L 2227/323* (2013.01); *H01L 2251/5315* (2013.01)

(56) References Cited

U.S. PATENT DOCUMENTS

| | | | |
|---|---|---|---|
| 9,632,352 B2 * | 4/2017 | Zhong | G02B 6/0055 |
| 9,761,641 B2 | 9/2017 | Liu | |
| 9,842,764 B2 * | 12/2017 | Bang | H01L 21/768 |
| 2012/0169977 A1 | 7/2012 | Tsubata | |
| 2017/0317152 A1 | 11/2017 | Hsu | |

FOREIGN PATENT DOCUMENTS

| | | |
|---|---|---|
| CN | 105140247 A | 12/2015 |
| CN | 105467660 A | 4/2016 |
| CN | 105974636 A | 9/2016 |

* cited by examiner

COLOR FILTER (CF) SUBSTRATE, MANUFACTURING METHOD THEREOF, DISPLAY PANEL AND DISPLAY DEVICE

The present application claims priority to the Chinese patent application No. 201710353545.4, filed on May 18, 2017, the entire disclosure of which is incorporated herein by reference as part of the present application.

TECHNICAL FIELD

At least one embodiment of the present disclosure relates to a color filter (CF) substrate, a manufacturing method thereof, a display panel and a display device.

BACKGROUND

Compared with liquid crystal display (LCD), organic light-emitting diode (OLED) display device has become the next-generation display technology due to the characteristics such as self-luminescence, rapid response, wide viewing angle, high brightness, colorfulness, light-weight and thin, etc.

SUMMARY

At least one embodiment of the present disclosure relates to a CF substrate, a manufacturing method thereof and a display panel, which can reduce influence on chromaticity of adjacent sub-pixels caused by light leakage.

At least one embodiment of the present disclosure provides a color filter (CF) substrate, comprising a plurality of sub-pixels, each of the plurality of sub-pixels comprising a CF layer, the CF layer being configured to allow light passing through the sub-pixel to display one color, and a barrier being disposed between at least two adjacent sub-pixels of different colors, and the barrier continuously extending between the sub-pixels separated by the barrier.

At least one embodiment of the present disclosure provides a method for manufacturing a color filter (CF) substrate, comprising: forming a plurality of sub-pixels, each of the plurality of sub-pixels comprising a CF layer, the CF layer being configured to allow light passing through the sub-pixel to display one color, and forming a barrier between at least two adjacent sub-pixels of different colors, the barrier continuously extending between the sub-pixels separated by the barrier.

At least one embodiment of the present disclosure provides a display panel comprising any CF substrate provided by at least one embodiment of the present disclosure.

At least one embodiment of the present disclosure provides a display device comprising any display panel provided by at least one embodiment of the present disclosure.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

An OLED component is generally composed of an anode, a light-emitting functional layer 213 and a cathode. OLED display devices can be divided into two types of bottom-emission and top-emission according to different light-emitting surfaces. Top-emission display device has become a research hot in recent years due to higher aperture ratio.

As for an inkjet printing OLED component, the top-emission display device is difficult to manufacture as the top-emission OLED display device requires uniform thickness of layers such as the light-emitting functional layer. In order to further improve the color gamut of the top-emission display device, OLED+CF technology is provided. After light passes through a corresponding CF layer of the OLED display device, other spectra other than specific spectra can be filtered and the specific spectra can be retained. Thus, the monochromatic purity of the OLED display device can be improved, and the color gamut of the OLED display device can be improved.

Figure 1:
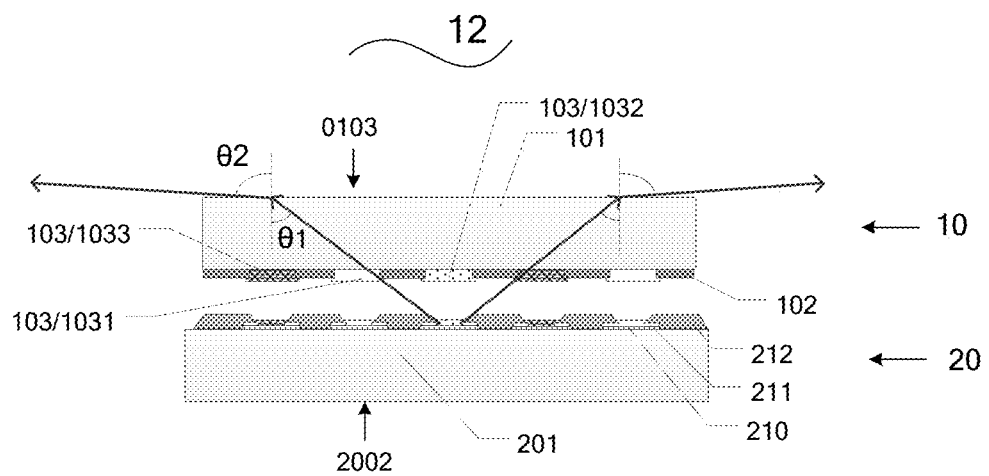
FIG. 1 is a schematic sectional view of a top-emission OLED display panel.

However, as illustrated in FIG. 1, a black matrix (BM) 102 and a CF layer 103 can be disposed on a first base substrate 101 of a CF substrate 10. Each sub-pixel 0103 includes the CF layer 103 which is configured to allow light passing through the sub-pixel to display one color. The CF layer 103 can include a red filter layer 1031, a green filter layer 1032 and a blue filter layer 1033. According to the color displayed after the light passes through the sub-pixel, the sub-pixels 0103 can include a red sub-pixel, a green sub-pixel and a blue sub-pixel. An array substrate 20 includes a light-emitting unit 2002. The light-emitting unit 2002 can include a first electrode 210. The first electrode 210 can be disposed on a second base substrate 201. The first electrode 210 can be made of transparent conductive oxide such as indium tin oxide (ITO), but is not limited thereto. Not all the structures of the light-emitting unit 2002 are illustrated in FIG. 1.

As illustrated in FIG. 1, in the top-emission OLED display device, there is a cell gap between the array substrate and the CF substrate after the array substrate 20 and the CF substrate 10 are cell-assembled, so light leakage tends to occur between the sub-pixels (e.g., RGB) 0103 in the case of emission, and hence color cross-talk can be caused. Description is given in the embodiment of the present disclosure by taking the case that one pixel includes sub-pixels of three primary colors of red (R), green (G) and blue (B) as an example, but not limited thereto. The sub-pixels can also adopt other colors.

As illustrated in FIG. 1, light leakage occurs due to the gap between the array substrate 20 and the CF substrate 10. θ1 refers to incidence angle; θ2 refers to emergence angle; the refractive index of air is 1.0; and the refractive index of glass is 1.5 (taking the case that the first base substrate 101 is a glass substrate as an example). Thus, in the case that θ1 is equal to 41°, θ2 is equal to 90°. That is to say, light with an incidence angle θ1 greater than 41° cannot be emitted, so light leakage will not occur; and light with an incidence angle θ1 less than 41° can be emitted, so light leakage will occur.

In FIG. 1, a pixel definition layer (PDL) can be disposed on the first electrode 210. For instance, as illustrated in FIG. 1, as for the inkjet printing display device, the PDL can include a two-layer structure, namely a first sub-PDL 211 and a second sub-PDL 212. The first sub-PDL 211 can be configured to define an actual light-emitting area of the light-emitting unit 2002 and can be made of a material with high surface energy, e.g., $SiO_2$ or $Si_3N_4$, etc. The second sub-PDL 212 can be configured to place ink of the inkjet printing component. The second sub-PDL 212 can be made of a material of which the surface has high hydrophobicity and can prevent ink from overflowing to the outside of the sub-pixel. The second sub-PDL 212 can be made of materials such as fluorine-containing acrylic resin or fluorinated polyimide resin.

As for an evaporation OLED component, special surface characteristics are not required, and the second sub-PDL 212 can be made of materials such as polyimide, acrylic resin, $SiO_2$ or ceramics.

Figure 2:
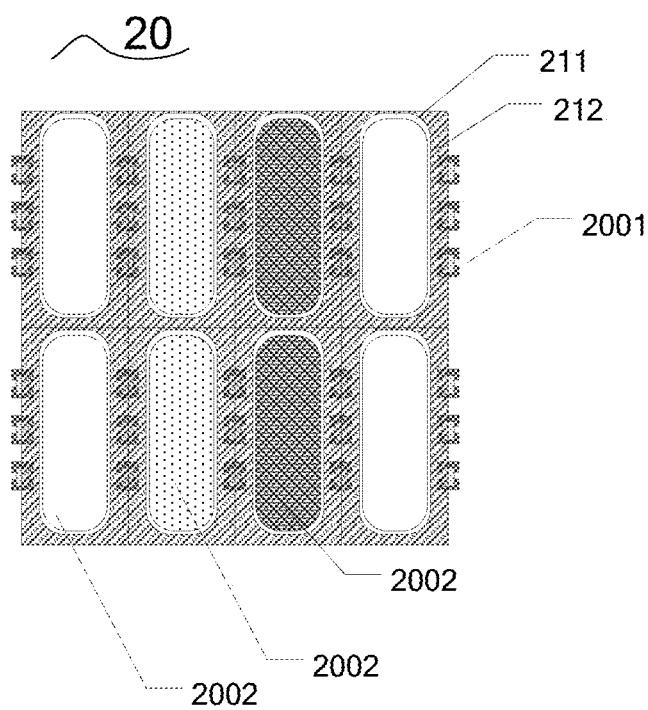
FIG. 2 is a schematic top view of an array substrate in a top-emission OLED display panel.

As illustrated in FIG. 2, the array substrate includes a thin film transistor (TFT) 2001, a sub-pixel region of an OLED, a first sub-PDL 211 and a second sub-PDL 212. According to the demands of an internal compensation circuit, structures such as 2T1C, 3T2C and 3T1C are arranged. As illustrated in FIG. 2, the TFT 2001 can be disposed in a long-side direction of the sub-pixel. As illustrated in FIG. 2, three TFTs 2001 are disposed along the long-side direction of each sub-pixel. The sub-pixel region of the OLED can be configured to define the light-emitting shape, position and size of the sub-pixel.

For instance, after the PDL is formed, a light-emitting functional layer 213 is formed on the first electrode 210. The light-emitting functional layer 213 can be composed of one or more layers selected from the group consisting of a hole injection layer (HIL), a hole transport layer (HTL), an emission layer (EML), a hole blocking layer (HBL), an electron blocking layer (EBL), an electron transport layer (ETL) and an electron injection layer (EIL). OLED can emit white light and then realizes color display after the color filter of the CF layer.

For instance, a width of the second sub-PDL 212 can be 5-30 μm and, further, can be 10 μm; a thickness of the second sub-PDL 212 can be 1-5 μm and, further, can be 1.5 μm; and a slope angle of the second sub-PDL 212 can be 40-60° and, further, can be 45°.

Figure 3:
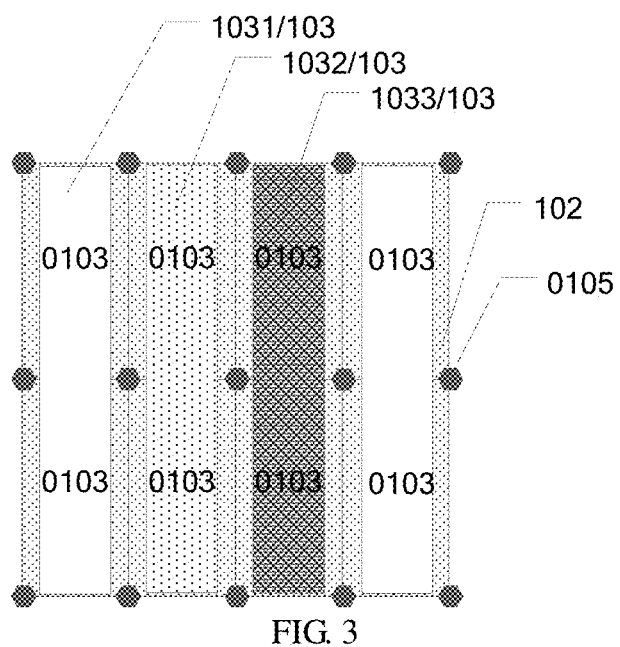
FIG. 3 is a schematic top view of a CF substrate corresponding to the array substrate in FIG. 2.

As illustrated in FIG. 3, a spacer 0105 with a shape of a column can be disposed on the CF substrate 10, and spacers 0105 can be arranged at four corners of the sub-pixels 0103.

For instance, a cell gap between the array substrate 20 and the CF substrate 10 can be 10-15 μm and, further, can be 10 μm. The cell gap is limited by pressing ability of a pressing apparatus.

For instance, as seen from a short-side direction of the sub-pixel, in the case that the cell gap is 15 μm and a width of the first sub-PDL 211 is 13 μm, θ1 is about 41°, and light leakage just does not occur. In view of the alignment error ±5 μm of the display device, in the case that a width of the second sub-PDL 212 is greater than 18 μm, θ1 can be greater than 41°. In actual sub-pixel design, in order to improve the aperture ratio as much as possible, a width of the second sub-PDL 212 in a short-side direction can be designed to be as narrow as possible. In order to reduce light leakage, the minimum width of the second sub-PDL 212, in the short-side direction of the sub-pixel, can be 18 μm.

Obviously, the improvement of the aperture ratio and the reduction of light leakage are in conflict with each other. As for high-resolution OLED display devices, light leakage and the aperture ratio must be comprehensively considered.

Figure 4:
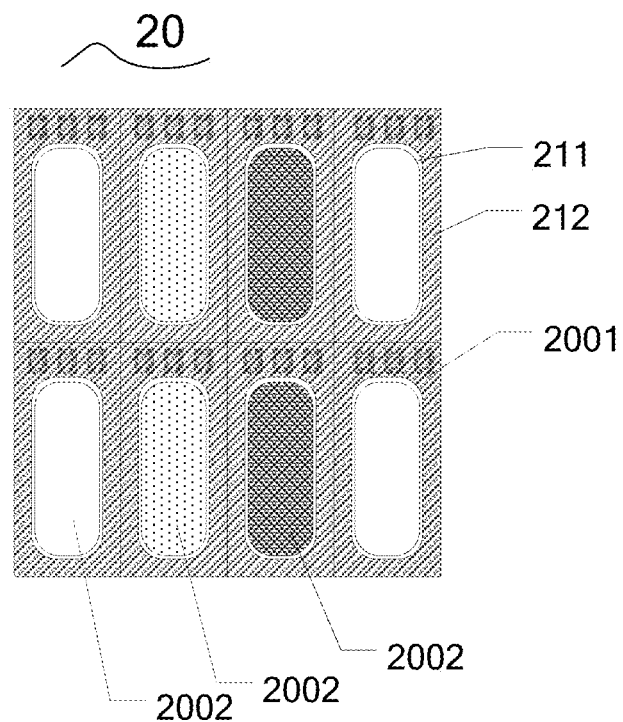
FIG. 4 is a schematic top view of an array substrate of another top-emission OLED display panel.
Figure 5:
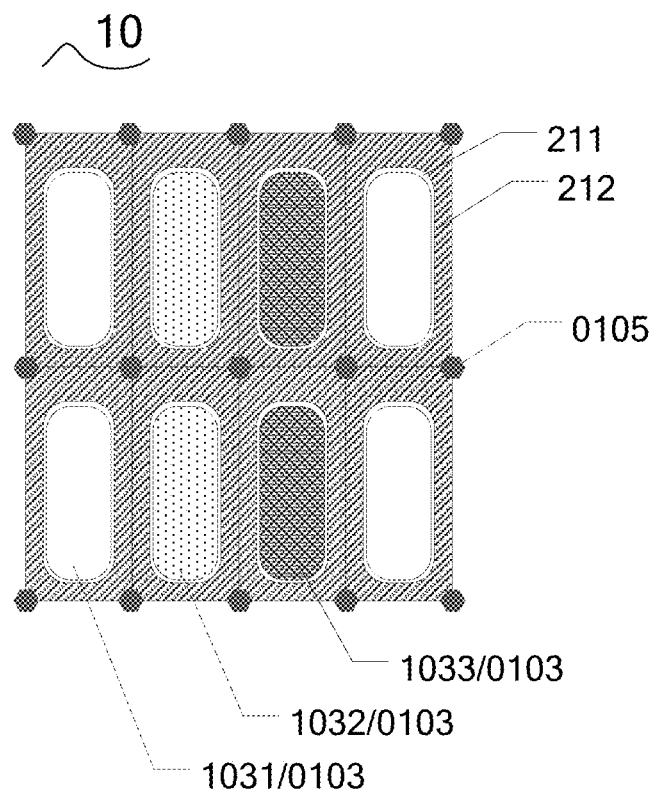
FIG. 5 is a schematic top view of a CF substrate corresponding to the array substrate in FIG. 4.

As illustrated in FIG. 4, in the array substrate 20, the TFTs 2001 are arranged along a short-side direction of the sub-pixel. As illustrated in FIG. 5 which is a plan view of the CF substrate 10 corresponding to FIG. 4, a spacer 0105 with a shape of a column is disposed on the CF substrate 10, and spacers 0105 can be arranged at four corners of each sub-pixel 0103. In the CF substrate 10, the sub-pixels 0103 can be arranged in an array.

For instance, as illustrated in FIG. 4, as seen from the long-side direction of the sub-pixel, as a width of the TFT is about 50 μm, which is greater than 18 μm, the risk of light leakage will not occur. Even in the case of light leakage, the sub-pixels have the same color, so the problem of color cast will not occur.

Figure 6:
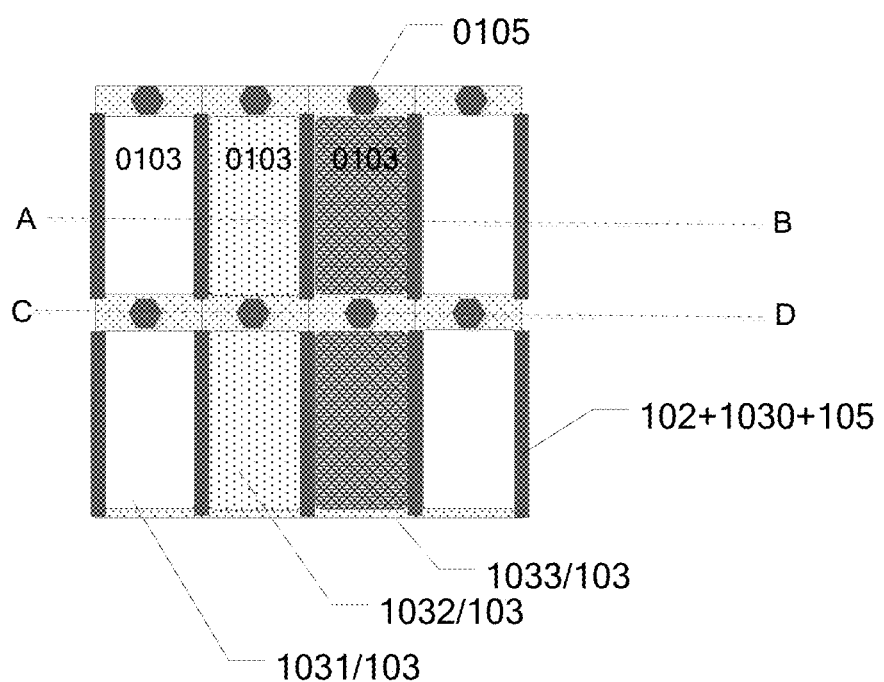
FIG. 6 is a schematic top view of a CF substrate provided by an embodiment of the present disclosure.

At least one embodiment of the present disclosure provides a CF substrate, which, as illustrated in FIG. 6, includes a plurality of sub-pixels 0103. Each of the plurality of sub-pixel 0103 includes a CF layer 103 which can be configured to allow light to pass through. The CF layer 103 is configured to allow light passing through the sub-pixel 0103 to display one color. A barrier 105 is disposed between at least two adjacent sub-pixels 0103 of different colors, and the barrier 105 continuously extends between the sub-pixels 0103 separated by the barrier. The barrier can have the functions of supporting and light blocking. In FIG. 6, 8 sub-pixels 0103 are illustrated, but the number of the sub-pixels in the embodiment of the present disclosure is not limited to those illustrated in the figure. For instance, that the barrier 105 continuously extends between the sub-pixels 0103 separated by the barrier, refers to that the barrier continuously extends between at least one sub-pixel 0103 separated by the barrier. Continuously extend, for instance, refers to no interval.

At least one embodiment of the present disclosure provides a CF substrate. As the continuously extending barrier is disposed between the sub-pixels 0103, light emitted from the light-emitting unit can be limited within a specific sub-pixel, so as to reduce influence on the chromaticity of adjacent sub-pixels caused by light leakage, and hence the color cross-talk between different sub-pixels can be avoided.

For instance, as illustrated in FIG. 6, the CF layers 103 can include a red filter layer 1031, a green filter layer 1032 and a blue filter layer 1033, but is not limited thereto.

For instance, the barrier 105 can be distributed in a strip shape. The barrier 105 can be disposed on the data line and have the function of light shield. For instance, the data line can be configured to apply an electrical signal to the TFT. For instance, a height of the barrier 105 can be 5-10 μm, is determined by the width of the second sub-PDL 212 and the exposure ability of photoresist, and can be determined by the target cell gap in the case of cell-assembly. As the barrier 105 has a strip shape, light emission can be well limited within specific sub-pixels, so as to avoid the risk of color cross-talk. The height, for instance, refers to a thickness in a direction perpendicular to the first base substrate.

As illustrated in FIG. 6, the CF substrate provided by an embodiment of the present disclosure can further include a spacer 0105 with a shape of a column (dot). The spacer 0105 can be disposed between the sub-pixels 0103 of the same color. For instance, in order to have better supporting function, the spacer 0105 is disposed at a position, where the barrier 105 is not formed, between adjacent sub-pixels. For instance, the spacer 0105 and the barrier 105 are respectively disposed on different sides of the sub-pixel. For instance, the dot-shaped spacer 0105 can be disposed on a TFT area, and the spacer 0105 can be arranged as large as possible and achieve the objective of stabilizing the cell gap. A height of the spacer 0105 can be greater than a height of the barrier 105. Thus, the spacer 0105 has the function of main support, and the barrier 105 has the function of auxiliary support, so as to avoid the deformation of the barrier 105 in the pressing process of the CF substrate and the array substrate.

According to the CF substrate provided by an embodiment of the present disclosure, as illustrated in FIG. 6, the plurality of sub-pixels 0103 are arranged in an array. The sub-pixels 0103 of the same color extend along a first direction. The sub-pixels 0103 of different colors are arranged along a second direction. The barrier 105 is provided with a gap between different sub-pixels 0103 in the first direction. The gap is formed at a broken position of the barrier 105. In the pressing process of the CF substrate and the array substrate, the barrier 105 tends to be deformed in the case of uneven stress. Due to the arrangement of the gap, the pressing force can be easily released and dispersed. Even in the case of deformation, the deformation can also be limited within a partial position. For instance, the first direction is perpendicular to the second direction. For instance, the first direction is a vertical direction along the paper surface, and the second direction is a horizontal direction along the paper surface.

Figure 7:
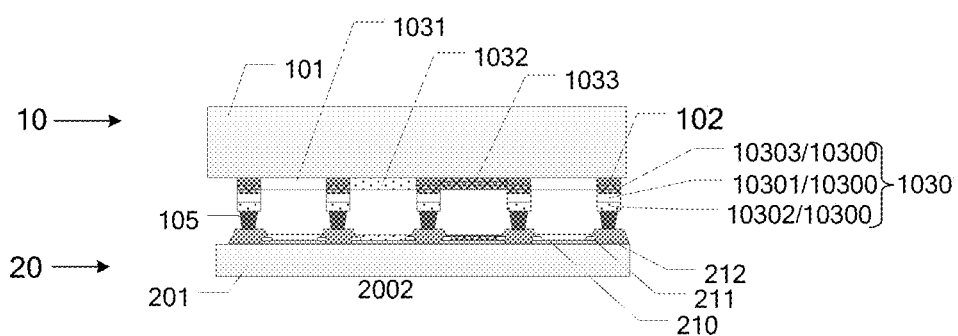
FIG. 7 is a schematic sectional view of a display panel including the CF substrate as illustrated in FIG. 6, provided by an embodiment of the present disclosure (a sectional view of the CF substrate as illustrated in FIG. 6 taken along line A-B)

As illustrated in FIG. 7, the CF substrate provided by an embodiment of the present disclosure further includes a first base substrate 101. The barrier 105 includes a cross section with a shape of a trapezoid. A short base of the trapezoid is farther away from the first base substrate 101 than a long base of the trapezoid; and a length of the long base is greater than that of the short base. The barrier 105 with the trapezoidal cross section is difficult to fall off in the pressing process of the CF substrate and the array substrate.

According to the CF substrate provided by an embodiment of the present disclosure, the barrier 105 can be made of an opaque resin material (light-absorption material). Thus, light of light leakage will be absorbed when passing through the barrier 105, and will not be emitted from adjacent sub-pixels. In order to further improve the light utilization rate, the barrier 105 can also select a material with high reflectivity.

As illustrated in FIG. 7, the CF substrate provided by an embodiment of the present disclosure includes at least two barriers 105, and the at least two barriers have substantially the same height, thus being favorable for supporting the cell gap. For instance, the CF substrate includes at least two barriers 105 disposed at different positions. For instance, the barriers 105 have substantially the same height. The substantially same height, for instance, includes the same height or the case that the ratio of the height difference to the average height is less than 5%. For instance, the spacer 0105 and the barrier 105 can also have substantially the same height, thus being favorable for supporting the cell gap. The spacer 0105 and the barrier 105 can be made of the same material and manufactured by the same manufacturing process. It should be noted that a height of the spacer 0105 can also be greater than a height of the barrier 105.

Figure 8:
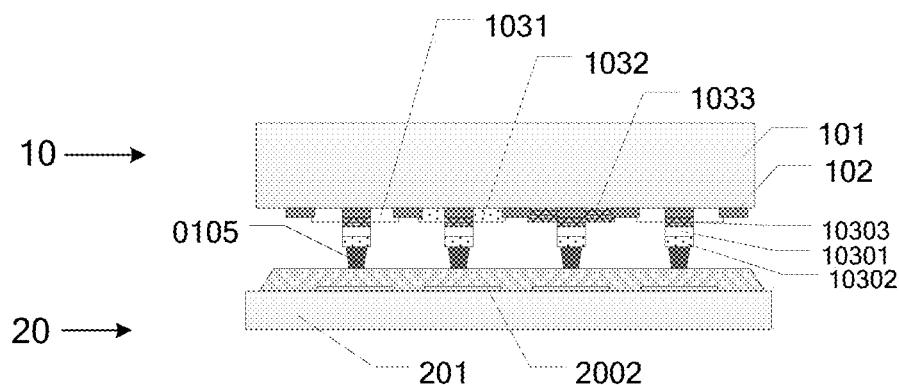
FIG. 8 is a schematic sectional view of a display panel including the CF substrate as illustrated in FIG. 6, provided by an embodiment of the present disclosure (a sectional view of the CF substrate as illustrated in FIG. 6 taken along line C-D)

According to the CF substrate provided by an embodiment of the present disclosure, as illustrated in FIGS. 7 and 8, the CF substrate 10 can further include a BM 102. The BM 102 can be disposed between adjacent sub-pixels 0103 to separate the sub-pixels 0103.

According to the CF substrate provided by an embodiment of the present disclosure, as illustrated in FIGS. 7 and 8, the CF substrate 10 can further include a CF stacked layer 1030. The CF stacked layer 1030 includes a plurality of CF sub-layers 10300 of different colors. For instance, the CF sub-layers 10300 can include a red sub-layer 10301, a green sub-layer 10302 and a blue sub-layer 10303. The CF stacked layer 1030 is opaque and can have the effect of the BM. A height of the CF stacked layer 1030 is greater than a height of the CF layer 103. The barrier 105 is disposed on the CF stacked layer 1030. An orthographic projection of the barrier 105 on the CF substrate falls within an orthographic projection of the CF stacked layer 1030 on the CF substrate 10. The CF stacked layer 1030 can be located between adjacent sub-pixels 0103.

Therefore, the CF stacked layer 1030 can have the function of replacing partial barrier 105 or replacing partial spacer 0105. A height of the barrier 105/the spacer 0105 in a display panel, including the CF substrate provided by the embodiment, can be less than a cell gap of a display device, and the strength of the barrier 105/the spacer 0105 can be improved. For instance, a height of the CF stacked layer 1030 can be greater than or equal to a height of the barrier 105.

For instance, a thickness (a height in a direction perpendicular to the first base substrate 101) of the CF sub-layer 10300 can be equal to or less than a thickness of the CF layer 103. For instance, a thickness of the red sub-layer 10301, the green sub-layer 10302 and the blue sub-layer 10303 can be respectively equal to a thickness of the red filter layer 1031, the green filter layer 1032 and the blue filter layer 1033, but is not limited thereto. The thickness of the red sub-layer 10301, the green sub-layer 10302 and the blue sub-layer 10303 can be respectively less than the thickness (the height in the direction perpendicular to the first base substrate 101) of the red filter layer 1031, the green filter layer 1032 and the blue filter layer 1033. For instance, the red sub-layer 10301 and the red filter layer 1031 are made of the same material and manufactured by the same manufacturing process; the green sub-layer 10302 and the green filter layer 1032 are made of the same material and manufactured by the same manufacturing process; and the blue sub-layer 10303 and the blue filter layer 1033 are made of the same material and manufactured by the same manufacturing process. If the CF sub-layers 10300 and the CF layers 103 with different thicknesses are required to be manufactured, a multi-tone mask can be adopted.

Figure 9:
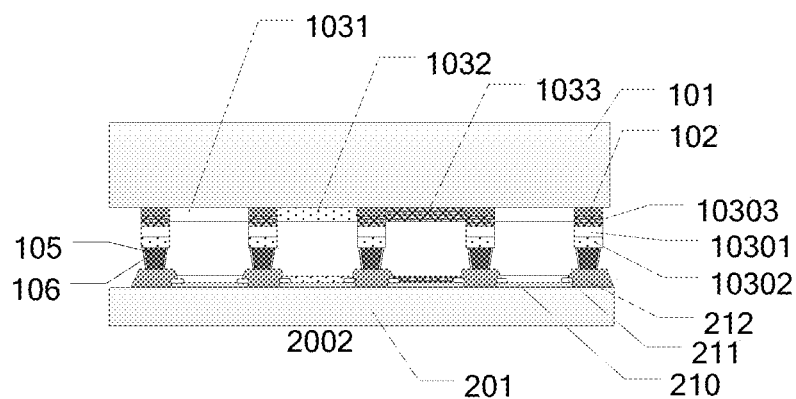
FIG. 9 is a schematic sectional view of a CF substrate provided by an embodiment of the present disclosure.

As illustrated in FIG. 9, according to the CF substrate provided by an embodiment of the present disclosure, in order to reduce the light loss of the sub-pixel caused by light leakage, a reflection layer 106 is disposed on a sidewall of the barrier 105 and is configured to reflect light irradiated thereon.

Figure 10:
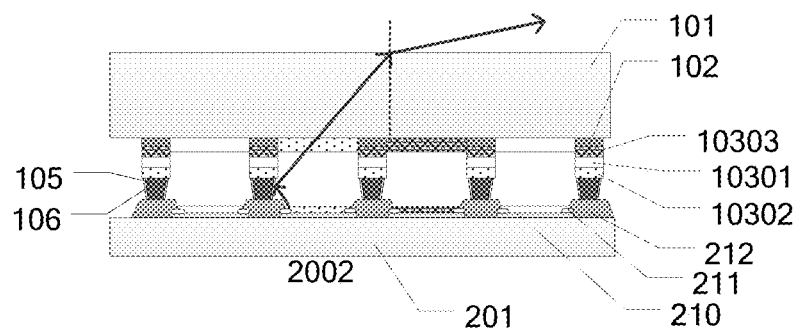
FIG. 10 is a schematic diagram illustrating the reduction of light leakage in a display panel formed by a CF substrate including a reflection layer, provided by an embodiment of the present disclosure.

For instance, as illustrated in FIG. 10, light irradiated onto the reflection layer 106 is reflected, so the utilization rate of emergent light of the light-emitting unit can be improved. The reflection layer 106 can adopt a reflective metal so as to improve the reflectivity of the barrier 105, so the light emitted from the light-emitting unit can be further reflected and arrives at the sub-pixel for emission. For instance, a reflection layer 106 can also be disposed on a sidewall of the spacer 0105, so as to improve the efficiency. Or the reflection layer 106 can also be replaced with a light-absorption layer which is configured to absorb light irradiated thereon.

Figure 11:
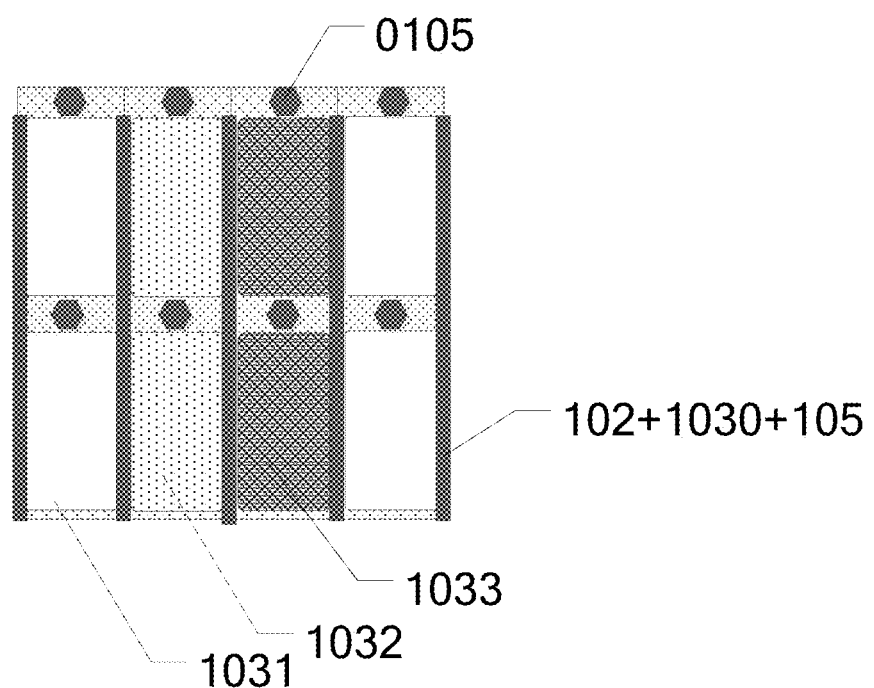
FIG. 11 is a schematic top view of a CF substrate provided by an embodiment of the present disclosure.

As illustrated in FIG. 11, according to the CF substrate provided by an embodiment of the present disclosure, in order to better reduce light leakage, the plurality of sub-pixels 0103 are arranged in an array; the sub-pixels 0103 of the same color extend along a first direction; the sub-pixels 0103 of different colors are arranged along a second direction; and the barrier 105 continuously extends along the first direction, namely the barrier 105 can extend from one side (one end) of the same surface of the first base substrate 101 to an opposite side (the opposite end) of the same surface of the first base substrate 101.

At least one embodiment of the present disclosure provides a method for manufacturing a CF substrate, which includes: forming a plurality of sub-pixels 0103, each of the plurality of sub-pixels 0103 including a CF layer 103 which is configured to allow light passing through the sub-pixel 0103 to display one color, and forming a barrier 105 between at least two adjacent sub-pixels 0103 of different colors, the barrier continuously extending between the sub-pixels 0103 separated by the barrier.

According to the method for manufacturing the CF substrate provided by an embodiment of the present disclosure, a reflection layer 106 is disposed on a sidewall of the barrier 105 and is configured to reflect light irradiated thereon.

According to the method for manufacturing the CF substrate provided by an embodiment of the present disclosure, the barrier 105 is made of an opaque resin material.

According to the method for manufacturing the CF substrate provided by an embodiment of the present disclosure, the barrier 105 has substantially the same height at various positions.

The method for manufacturing the CF substrate provided by an embodiment of the present disclosure further includes: providing a first base substrate 101. The barrier 105 includes a cross section with a shape of a trapezoid, and a short base of the trapezoid is farther away from the first base substrate 101 than a long base of the trapezoid. For instance, a width of the long base of the trapezoid is 10-15 μm, and a width of the short base of the trapezoid can be 3-10 μm.

According to the method for manufacturing the CF substrate provided by an embodiment of the present disclosure, the plurality of sub-pixels 0103 are arranged in an array; the sub-pixels 0103 of the same color extend along a first direction; the sub-pixels 0103 of different colors are arranged along a second direction; and the barrier 105 continuously extends along the first direction.

According to the method for manufacturing the CF substrate provided by an embodiment of the present disclosure, the plurality of sub-pixels 0103 are arranged in an array; the sub-pixels 0103 of the same color extend along a first direction; the sub-pixels 0103 of different colors are arranged along a second direction; and the barrier 105 is provided with a gap between different sub-pixels 0103 in the first direction. Therefore, the barrier 105 can limit light emitted from a light-emitting unit within a specific sub-pixel, so as to prevent influence on the chromaticity of adjacent sub-pixels caused by light leakage, and hence the color cross-talk between different sub-pixels can be avoided.

The method for manufacturing the CF substrate provided by an embodiment of the present disclosure further includes: forming a spacer 0105. The spacer 0105 is disposed between the sub-pixels 0103 of the same color. The spacer 0105 and the barrier 105 can have substantially the same height.

The method for manufacturing the CF substrate provided by an embodiment of the present disclosure further includes: forming a CF stacked layer 1030. The CF stacked layer 1030 includes a plurality of CF sub-layers 10300 of different colors. A height of the CF stacked layer 1030 is greater than that of the CF layer 103.

The method for manufacturing the CF substrate provided by an embodiment of the present disclosure can include the following steps.

Figure 12:
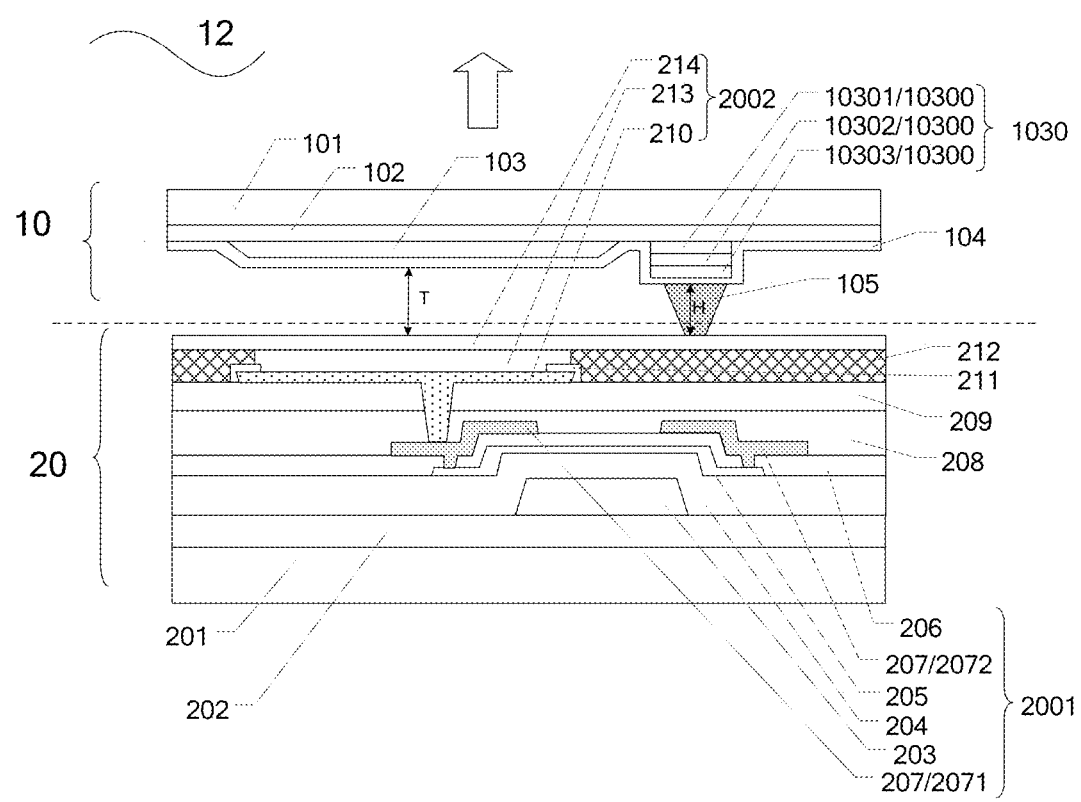
FIG. 12 is a schematic sectional view of a display panel provided by an embodiment of the present disclosure.

A BM, a CF layer (RGB) 103 and an over coating layer 104 are formed on the first base substrate 101 by exposure and development processes, and subsequently, the spacer 0105 and the barrier 105 are formed on the over coating layer 104. The CF substrate can obtain appropriate support, cell gap and height uniformity by adjusting the shape, the height and the position of the spacer 0105 and the barrier 105. Namely, a structure of BM→R→G→B→OC→barrier 105/spacer 0105 is adopted. The formed CF substrate can be as illustrated in FIG. 12. In order to improve the reflectivity of the spacer 0105 and the barrier 105, a resin material with high reflectivity can be adopted, and a reflection layer can be further disposed on a sidewall of the barrier 105 and the spacer 0105 to improve the reflectivity.

At least one embodiment of the present disclosure provides a display panel 12, which, as illustrated in FIG. 12, includes any one of the CF substrates provided by at least one embodiment of the present disclosure.

As illustrated in FIG. 12, the display panel provided by at least one embodiment of the present disclosure further includes an array substrate 20. The array substrate 20 and the CF substrate 10 are cell-assembled. A height H of the barrier 105 is less than a cell gap T of a cell formed by the array substrate 20 and the CF substrate 10. For instance, the cell gap T is a thickness of the cell at a position of the sub-pixel 0103. For instance, a height of the CF stacked layer 1030 can be greater than or equal to a height of the barrier 105. For instance, a ratio of a height of the CF stacked layer 1030 to a height of the barrier 105 is less than or equal to 1.5. For instance, if the cell gap T is 8 µm, a height of the CF stacked layer 1030 can be 6 µm (a height of each sub-layer can be 2 µm, and the height of those having the cell gap supporting function can be 4 µm), and a height of the barrier 105/the spacer 0105 can be 4 µm. The cell gap can be adjusted according to structural demands, which is favorable for filling of sealant and controlling of light leakage.

For instance, the array substrate can be manufactured by the following methods.

(1) Forming a TFT layer: including the step of forming a TFT pattern with a thickness of 1 µm-100 µm on a second base substrate 201 by multiple film forming, exposure, etching and development processes. The common film forming process includes sputtering method, plasma enhanced chemical vapor deposition (PECVD) method, evaporation, spin coating, blade coating, printing, inkjet printing, etc. FIG. 12 illustrates a representative TFT structure: a buffer layer 202, a gate electrode 203, a gate insulation layer 204, an active layer 205, an etch stop layer 206, a source/drain electrode layer 207 (including a source electrode 2072 and a drain electrode 2071), a passivation layer 208, a planarization layer 209 and a first electrode 210 are sequentially formed on the second base substrate 201.

(2) Forming a PDL layer: forming a first sub-PDL 211 and a second sub-PDL 212 on the first electrode 210.

(3) Forming a light-emitting functional layer 213:

White organic light-emitting diode (WOLED) structure: as a large-size OLED panel can be difficult to manufacture with a fine metal mask (FMM), the top-emission OLED display device generally adopts a WOLED device structure, namely the light-emitting functional layer 213 and a second electrode 214 are sequentially evaporated on the PDL with an open mask, so as to form a planar second electrode 214.

Of course, an RGB three primary color structure can also be directly formed; the film forming method includes evaporation, inkjet printing, etc.; and subsequently, a planar cathode structure is formed.

For instance, a light-emitting unit 2002 can include the first electrode 210, the light-emitting functional layer 213 and the second electrode 214. The light-emitting units 2002 can be in a one-to-one correspondence with the sub-pixels 0103.

After the array substrate 20 and the CF substrate 10 are formed, vacuum pressing and cell-assembly can be performed to form the display panel. The CF substrate and the array substrate are cell-assembled under vacuum. The vacuum cell-assembly can control the accurate alignment of the CF substrate and the array substrate. For instance, the alignment error of the CF substrate and the array substrate is controlled to be within ±5 µm, so as to reduce the probability of light leakage.

According to the display panel provided by at least one embodiment of the present disclosure, the CF substrate further includes a CF stacked layer 1030. The CF stacked layer 1030 includes a plurality of CF sub-layers 10300 of different colors. A height of the CF stacked layer 1030 is greater than that of the CF layer 103. The barrier 105 is disposed on the CF stacked layer 1030; and an orthographic projection of the barrier 105 on the CF substrate 10 falls within an orthographic projection of the CF stacked layer 1030 on the CF substrate 10.

In the CF substrate, the manufacturing method and the display panel, provided by the embodiments of the present disclosure, same or similar designs can be referred to each other, so no further description will be given here.

At least one embodiment of the present disclosure further provides a display device, which includes any display panel provided by at least one embodiment of the present disclosure.

For instance, the display device can be a display device such as an OLED display or any product or component with display function including the display device, e.g., a TV, a digital camera, a mobile phone, a watch, a tablet PC, a notebook computer or a navigator.

The following statements should be noted:

(1) Unless otherwise defined, the same reference numeral represents the same meaning in the embodiments of the disclosure and accompanying drawings.

(2) The accompanying drawings involve only the structure(s) in connection with the embodiment(s) of the present disclosure, and other structure(s) can be referred to common design(s).

(3) For the purpose of clarity only, in accompanying drawings for illustrating the embodiment(s) of the present disclosure, the thickness and size of a layer or a structure can be enlarged. However, it should understood that, in the case in which a component or element such as a layer, film, area, substrate or the like is referred to be "on" or "under" another component or element, it can be directly on or under the another component or element or a component or element is interposed therebetween.

(4) In case of no conflict, features in one embodiment or in different embodiments can be combined.

What have been described above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

What is claimed is:

1. A color filter (CF) substrate, comprising a plurality of sub-pixels, each of the plurality of sub-pixel comprising a CF layer, the CF layer being configured to allow light passing through the sub-pixel to display one color, and a barrier being disposed between at least two adjacent sub-pixels of different colors, and the barrier continuously extending between the sub-pixels separated by the barrier,
the CF substrate further comprising a CF stacked layer, wherein the CF stacked layer comprises a plurality of CF sub-layers of different colors, and a height of the CF stacked layer is greater than that of the CF layer.

2. The CF substrate according to claim 1, wherein a reflection layer is disposed on a sidewall of the barrier.

3. The CF substrate according to claim 1, wherein the barrier is made of an opaque resin material.

4. The CF substrate according to claim 1, wherein the CF substrate comprises at least two barriers, and the at least two barriers have substantially a same height.

5. The CF substrate according to claim 1, further comprising a base substrate, wherein the barrier has a cross section with a shape of a trapezoid, a short base of the trapezoid is farther away from the base substrate than a long base of the trapezoid, and a length of the long base is greater than that of the short base.

6. The CF substrate according to claim 1, wherein the plurality of sub-pixels are arranged in an array, the sub-pixels of a same color extend along a first direction, the sub-pixels of different colors are arranged along a second direction, and the first direction is intersected with the second direction, wherein the barrier continuously extends along the first direction.

7. The CF substrate according to claim 1, wherein the plurality of sub-pixels are arranged in an array, the sub-pixels of a same color extend along a first direction, the sub-pixels of different colors are arranged along a second direction, and the first direction is intersected with the second direction, wherein the barrier is provided with a gap between different sub-pixels in the first direction.

8. The CF substrate according to claim 1, further comprising a spacer, wherein the spacer is disposed between the sub-pixels of a same color, and a height of the spacer is greater than or equal to that of the barrier.

9. The CF substrate according to claim 1, wherein the barrier is disposed on the CF stacked layer, and an orthographic projection of the barrier on the CF substrate falls within an orthographic projection of the CF stacked layer on the CF substrate.

10. A display panel comprising the CF substrate according to claim 1.

11. A method for manufacturing a color filter (CF) substrate, comprising:
    forming a plurality of sub-pixels, each of the plurality of sub-pixels comprising a CF layer, the CF layer being configured to allow light passing through the sub-pixel to display one color;
    forming a barrier being between at least two adjacent sub-pixels of different colors, the barrier continuously extending between the sub-pixels separated by the barrier; and
    forming a CF stacked layer,
    wherein the CF stacked layer comprises a plurality of CF sub-layers of different colors, and a height of the CF stacked layer is greater than that of the CF layer.

12. The method for manufacturing the CF substrate according to claim 11, further comprising: forming a reflection layer on a sidewall of the barrier.

13. The method for manufacturing the CF substrate according to claim 11, wherein the barrier is made of an opaque resin material.

14. The method for manufacturing the CF substrate according to claim 11, wherein the CF substrate comprises at least two barriers, and the at least two barriers have substantially a same height.

15. The method for manufacturing the CF substrate according to claim 11, further comprising providing a base substrate, wherein the barrier has a cross section with a shape of a trapezoid, a short base of the trapezoid is farther away from the base substrate than a long base of the trapezoid, and a length of the long base is greater than that of the short base.

16. The method for manufacturing the CF substrate according to claim 11, wherein the plurality of sub-pixels are arranged in an array, the sub-pixels of a same color extend along a first direction, the sub-pixels of different colors are arranged along a second direction, and the first direction is intersected with the second direction; wherein the barrier continuously extends along the first direction.

17. The method for manufacturing the CF substrate according to claim 11, wherein the plurality of sub-pixels are arranged in an array, the sub-pixels of a same color extend along a first direction, the sub-pixels of different colors are arranged along a second direction, and the first direction is intersected with the second direction; wherein the barrier is provided with a gap between different sub-pixels in the first direction.

18. A display panel comprising a color filter (CF) substrate, the CF substrate comprising a plurality of sub-pixels, each of the plurality of sub-pixels comprising a CF layer, the CF layer being configured to allow light passing through the sub-pixel to display one color, and a barrier being disposed between at least two adjacent sub-pixels of different colors, and the barrier continuously extending between the sub-pixels separated by the barrier,
    the display panel further comprising an array substrate, wherein the array substrate and the CF substrate are cell-assembled, and a height of the barrier is less than a cell gap of a cell formed by the array substrate and the CF substrate.

19. A display device comprising the display panel according to claim 18.

* * * * *